(12) United States Patent
Wege et al.

(10) Patent No.: US 6,511,918 B2
(45) Date of Patent: Jan. 28, 2003

(54) METHOD OF STRUCTURING A METAL-CONTAINING LAYER

(75) Inventors: Stephan Wege, Weissig (DE); Kerstin Krahl, Radeberg (DE)

(73) Assignee: Infineon Technologies AG, Munich (DE)

(*) Notice: Subject to any disclaimer, the term of this patent is extended or adjusted under 35 U.S.C. 154(b) by 2 days.

(21) Appl. No.: 09/873,229

(22) Filed: Jun. 4, 2001

(65) Prior Publication Data
US 2002/0011461 A1 Jan. 31, 2002

Related U.S. Application Data (63) Continuation of application No. PCT/DE99/03876, filed on Dec. 13, 1999.

(30) Foreign Application Priority Data

Dec. 4, 1998 (DE) .......................................... 198 56 082

(51) Int. Cl.$^7$ ............................................. H01L 21/302
(52) U.S. Cl. .................. 438/714; 438/720; 438/722; 438/723; 438/724; 216/67; 216/75; 216/76; 216/3; 216/6
(58) Field of Search ................................. 438/714, 720, 438/722, 723, 724; 216/67, 75, 76, 3, 6

(56) References Cited

U.S. PATENT DOCUMENTS

| 3,923,568 A | 12/1975 | Bersin |
| 3,951,709 A | 4/1976 | Jacob |
| 4,026,742 A | 5/1977 | Fujino |
| 4,432,132 A | 2/1984 | Kinsbron et al. |
| 4,568,410 A | * 2/1986 | Thornquist ................... 156/643 |
| 5,382,320 A | 1/1995 | Desu et al. |
| 5,431,773 A | * 7/1995 | Ikeda et al. .................... 216/23 |
| 5,624,583 A | * 4/1997 | Tokashiki et al. ........... 438/720 |
| 5,866,484 A | 2/1999 | Muto |
| 6,350,699 B1 | * 2/2002 | Maa et al. ................... 438/720 |

FOREIGN PATENT DOCUMENTS

| DE | 27 38 839 | 3/1979 |
| EP | 0 547 884 A1 | 6/1993 |
| JP | 07254606 A | 10/1995 |
| JP | 10178095 | 6/1998 |

OTHER PUBLICATIONS

Kim, Jae–Whan et al.: "Reactive ion etching mechanism of plasma enhanced chemically vapor deposited aluminum oxide film in $CF_4/O_2$ plasma", Journal of Applied Physics, American Institute of Physics, vol. 78, Aug. 1, 1995, pp. 2045–2049.

* cited by examiner

*Primary Examiner*—George Goudreau
(74) *Attorney, Agent, or Firm*—Laurence A. Greenberg; Werner H. Stemer; Ralph E. Locher

(57) ABSTRACT

The processes allow structuring of a metal-containing layer. The metal-containing layer is etched, using an etching mask, in a plasma-assisted etching gas atmosphere at a temperature of over 130° C. and in the presence of at least one halogen compound and at least one oxidizing agent. The concentration of the oxidizing agent is thereby set higher than the concentration of the halogen compound.

12 Claims, 5 Drawing Sheets

METHOD OF STRUCTURING A METAL-CONTAINING LAYER

CROSS-REFERENCE TO RELATED APPLICATION

This application is a continuation of copending International Application No. PCT/DE99/03876, filed Dec. 13, 1999, which designated the United States.

BACKGROUND OF THE INVENTION

Field of the Invention

The invention resides in the field of semiconductor technology and relates, more specifically, to a process for structuring a metal-containing layer.

In semiconductor technology, there is a high demand for structuring processes for a wide range of layers made from different materials. For example, for the fabrication of CMOS transistors, it is necessary to etch the relatively thin gate dielectric without contaminating adjacent regions. Hitherto, silicon oxide has been used as dielectric material. However, the increasing trend toward miniaturization means that the gate dielectric has to become increasingly thin in order to maintain the required capacitive coupling of the gate electrode to the channel region situated beneath the gate dielectric. However, reducing the thickness of the gate dielectric entails the risk of an undesirable electrical breakdown and the possibility of tunneling of electrons. Therefore, it is attempted to replace the silicon oxide with other materials of a higher dielectric constant which, on account of their dielectric constant, allow a greater material thickness for the same electrical properties (capacitance).

Furthermore, it is also desired, during the fabrication of semiconductor memories which use a capacitor for storing charges (DRAM), for the capacitor dielectric made from silicon oxide which has previously been used to be replaced by a material with a higher dielectric constant.

The structuring processes used are, for example, physical processes (sputtering), in which accelerated ions are directed onto the layer to be structured and thus abrade this layer. A problem of these processes is the relatively low selectivity between the layer to be structured and the mask material used, so that accurate transfer of the structure is often impossible.

By contract, processes which use etching gases have a higher selectivity. Examples of processes of that type are described, for example, in U.S. Pat. No. 3,951,709, German published patent application DE 27 38 839 A1, Japanese published patent application JP 07-254606 A, and U.S. Pat. Nos. 4,026,742, 5,382,320, and 3,923,568. Those prior art processes, however, can only partially be applied to layers of dielectric nature.

SUMMARY OF THE INVENTION

The object of the present invention is to provide a method of structuring a metal-containing layer which overcomes the above-noted deficiencies and disadvantages of the prior art devices and methods of this general kind, and which enables simple structuring of a metal-containing layer, in particular a dielectric layer, with a high selectivity.

With the above and other objects in view there is provided, in accordance with the invention, a method of structuring a metal-containing layer, which comprises the following steps:

providing a metal-containing layer on a substrate, the metal-containing layer consisting of titanium (Ti), titanium oxide ($TiO_x$), tantalum (Ta), tantalum oxide ($Ta_xO_y$), aluminum (Al), aluminum oxide ($Al_xO_y$) or a mixture of these metals and oxides;

applying and structuring an etching mask on the metal-containing layer; and etching the metal-containing layer, using the etching mask, in a plasma-assisted etching gas atmosphere at a temperature of over 130° C. and in a presence of at least one halogen compound and at least one oxidizing agent, wherein a concentration of the oxidizing agent is higher than a concentration of the halogen compound, and the halogen compound contains $NF_3$.

In accordance with an added feature of the invention, the halogen compound is a fluorinated carbon or a fluorinated hydrocarbon.

In accordance with an additional feature of the invention, the halogen compound is $SF_6$ or $CF_4$.

In accordance with another feature of the invention, the halogen compound is $CHF_3$.

In accordance with a further feature of the invention, the temperature during the etching is set to above 200° C., and preferably to about 250° C.

In accordance with again an added feature of the invention, the halogen compound is present in a concentration by volume of between 1% and 10%, and the oxidizing agent is present in a concentration by volume of between 90% and 99%.

In accordance with again an additional feature of the invention, the etching mask is formed of a material which, by reaction with the oxidizing agent, can be to a very great extent passivated with respect to the halogen compound. Preferably, the etching mask is formed of silicon oxide or polysilicon.

In accordance with again another feature of the invention, oxygen is employed as the oxidizing agent.

In accordance with a concomitant feature of the invention, the etching of the metal-containing layer is assisted by additionally employing physical abrasion with ions.

The process according to the invention can be used to etch metal-containing layers in particular with a high selectivity with respect to silicon oxide and polysilicon. The metal-containing layer may in this case consist of titanium (Ti), tantalum (Ta), titanium oxide ($TiO_x$), tantalum oxide ($Ta_xO_y$), aluminum (Al), aluminum oxide ($Al_xO_y$) or a mixture of the above-mentioned oxides and metals. It has been found that metal-containing layers of this type, at temperatures of over 130° C., react with the halogen radicals which are produced in the plasma and form volatile compounds. These can therefore readily be vaporized from the metal-containing layer. It is expedient for the temperature for etching of the metal-containing layer to be selected between 200° C. and 300° C., preferably at approximately 250° C. At higher temperatures, the metal halides formed during the etching can be vaporized more easily, so that if appropriate it is even possible to select temperatures of over 300° C., for example of 350° C. This is particularly advantageous for metal halides of low volatility.

At high temperatures of this level, it is recommended to use an etching mask made from silicon oxide or polysilicon. To prevent these mask materials from being attacked by the halogen compound, a relatively high proportion of oxidizing agent is added to the etching gas mixture. This oxidizing agent passivates at least the exposed mask surface, i.e. the upper side and the side edges of the etching mask, by oxidation, so that the halogen compound can only attack the etching mask to a slight extent. As a result, the etching mask is passivated to a very great extent. This also contributes to a high dimensional stability during the transfer of the structure from the etching mask to the metal-containing layer. A suitable oxidizing agent is in particular oxygen in a concentration of over 50%, preferably between 90% and 99%. Preferred halogen compounds are fluorinated carbons or hydrocarbons, in particular $CF_4$, $SF_6$, $NF_3$ or $CHF_3$, the concentration of which is lower than the concentration of the oxidizing agent. The concentration of the halogen compound is preferably below 20%, particularly preferably between 1% and 10%.

When using fluorinated hydrocarbons, a polymer film may form during the etching process.

Under certain circumstances, this film may then have to be removed. It is also possible to leave this polymer film on the layer which is to be etched, should this prove desirable.

In the case of fluorinated carbons, a polymer film of this type is not formed, so that particularly clean etching can be carried out using these etching gases.

The relatively high proportion of oxidizing agent during the etching can also lead to oxidation of the metal-containing layer, which is consequently easier for the halogen compound to attack. It is even possible, by means of the process according to the invention, to etch precious metals or metal oxide layers which are partially in polycrystalline form.

This process is preferably used for the fabrication of transistors and of memory cells.

Other features which are considered as characteristic for the invention are set forth in the appended claims.

Although the invention is illustrated and described herein as embodied in a method of structuring a metal-containing layer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
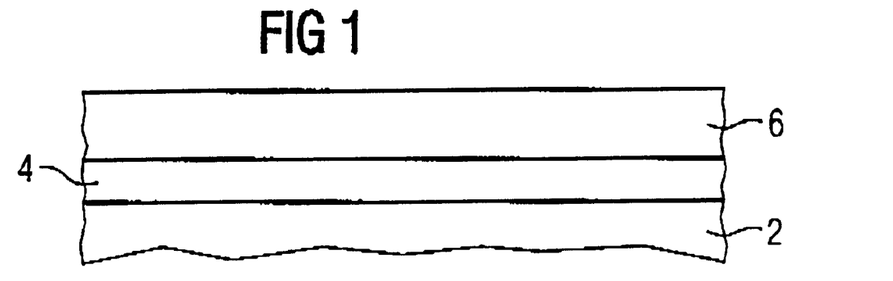
FIGS. 1 to 3 are partial sectional side views illustrating individual process steps of the process according to the invention.

Referring now to the figures of the drawing in detail and first, particularly, to FIG. 1 thereof, first of all, a substrate 2 is provided, on which a metal-containing layer 4 and a further layer 6 to form an etching mask 8 are arranged. If the process is used for the fabrication of a transistor, the substrate 2 preferably consists of silicon, in which non-illustrated doping regions have been created. The metal-containing layer 4 thereby serves to form the gate dielectric of the transistor. If, on the other hand, this process is used during the production of a semiconductor memory device, the substrate may also consist of an insulating dielectric, for example silicon oxide, or of silicon.

In the exemplary embodiment described here, the metal-containing layer 4 consists of titanium or titanium oxide ($TiO_x$). The further layer 6 is a layer of polysilicon or of a resist material which is relatively temperature-stable and only slightly oxidizable.

First of all, the further layer is structured in a suitable way, which in the case of a resist layer takes place directly using photolithography and in the case of a polysilicon layer takes place with the aid of a layer that can be structured by photolithography. The result is the structure illustrated in FIG. 2, having the etching mask 8 on the metal-containing layer 4.

Figure 2:
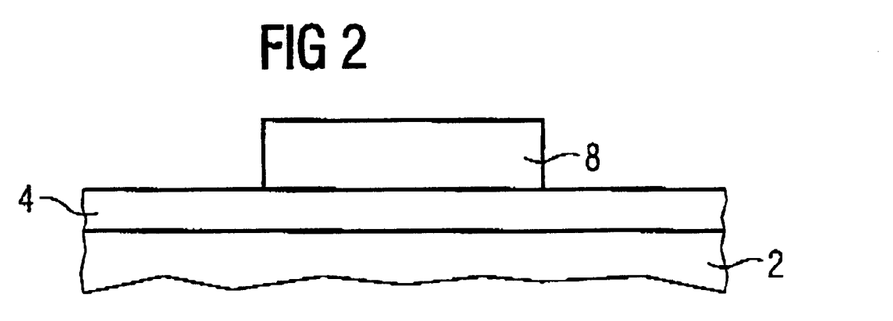

Then, an etching gas mixture comprising $CF_4$ and oxygen ($O_2$) is provided for the dry etching of the metal-containing layer 4. This takes place in a plasma reactor. In the present exemplary embodiment, an etching reactor for—as far as possible—isotropic etching was used. However, the process according to the invention may also be configured as an anisotropic etching process. Despite the isotropic etching described here, good transfer of the structuring from the etching mask 8 to the metal-containing layer 4 is possible, since firstly the etching mask 8 is passivated during the etching and is therefore attacked to a relatively minor extent, and secondly, in the case of relatively thin metal-containing layers 4, only a slight undercut etching of the etching mask 8 is possible. If necessary, the etching operation may also be assisted by a physical etching component. In this case, ions are accelerated toward the metal-containing layer, thus contributing only to the abrasion of this layer in the regions which are not covered by the etching mask 8.

The substrate 2 with the metal-containing layer 4 is heated to a temperature of between 230° C. and 270° C., preferably to 250° C., in the etching reactor. Furthermore, it is expedient for the entire process chamber to be brought to this temperature, in order to avoid any disruptive temperature gradients. Then, the etching gas mixture is introduced into the etching reactor and, by means of inductive high-frequency coupling, is excited to form a plasma. The plasma excitation may also be effected by microwave excitation.

The plasma excitation causes the halogen compound, in this case $CF_4$, to break down to form halogen radicals (fluorine radicals). These radicals can then attack the metal-containing layer 4 and in the process form metal halides. If the metal-containing layer 4 consists of titanium or titanium oxide, $TiF_x$, for example, is formed.

On account of the high oxygen content in the etching gas mixture, the titanium in the metal-containing layer 4 is initially at least partially oxidized to form titanium oxide ($TiO_x$). If the metal-containing layer 4 consists almost entirely of titanium oxide, the titanium oxide reacts directly with the fluorine radicals to form $TiF_x$. In this case, some of the oxygen reacts with the carbon to form $CO_x$.

Figure 3:
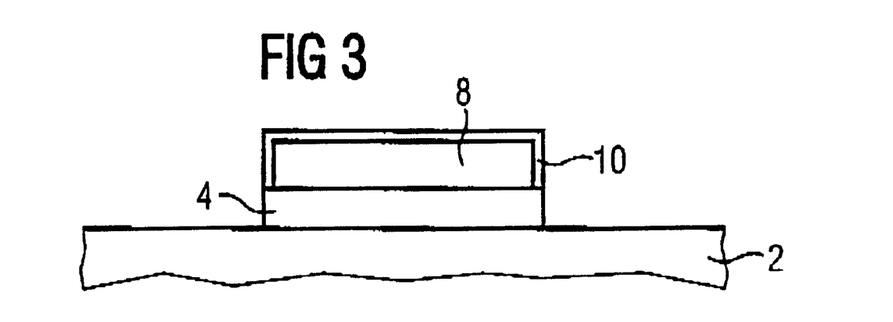

The high oxygen content, which is preferably over 90%, also leads to the passivation of the etching mask 8. Particularly when using polysilicon as mask material, the surface of the etching mask 8 is oxidized and can therefore withstand the attack of the fluorine radicals for a significantly longer time. A benefit of this is that $CF_4$ is present in a relatively low concentration, i.e. of between 1% and 10%, and therefore does not lead to a strong etching attack. Favorable mixing ratios between $CF_4$ and $O_2$ are between 1:99 and 20:80. The passivation layer 10 formed by the oxygen is illustrated in FIG. 3. Even though, despite the relatively great dilution of the halogen compound, the etching mask may be partially abraded by the attack from the radicals, the presence of oxygen means that a fresh passivation layer 8 is continuously formed, counteracting the abrasion. As a result, the etching away of polysilicon as etching mask material is slowed significantly, resulting in a high selectivity between polysilicon and the metal-containing layer.

The reason for the relatively low abrasion of polysilicon as etching mask by the fluorine radicals is assumed to lie in the relatively high binding energy of $SiO_x$ or $SiO_2$. Its binding energy is too high to be etched significantly by the low fluorine content. By contrast, the binding energy of $TiO_x$ would be significantly lower for the purpose of resisting the fluorine attack. Therefore, it is expedient to oxidize the titanium layer.

The etching mechanism on which the process according to the invention is based can therefore be described as follows: As a result of the high level of oxidizing agents, first of all the metal-containing layer is oxidized. If a metal oxide layer is already present, there is no need for any additional oxidation. Then, the metal oxide, in particular $TiO_x$, $Ta_xO_y$ and $Al_xO_y$, is etched away by the halogen compound. During this etching, however, the concentration of the oxidizing agent remains sufficiently high to, if appropriate, passivate the etching mask by oxidizing it. Particularly when using silicon or silicon oxide as etching mask, the oxidation of the etching mask leads to it being passivated with respect to the halogen compounds. However, the oxidation of the metal-containing layer does not necessarily have to take place by means of a prior oxidation step. It is also possible for the metal-containing layer to be oxidized continuously, i.e. in layers, and for the layer which has been oxidized in each case to be removed with the halogen compound.

If, to assist the etching, ions are additionally accelerated onto the metal-containing layer 4, the passivation of the etching mask 8 also contributes to its greater ability to withstand this step. In this case, the partially abraded passivation layer 10 is constantly renewed. As a result of the accelerated ions, the structuring process has an additional physical etching component which leads to a greater degree of anisotropy. The ions may either simultaneously be the fluorine radicals formed or may be formed by additional ions, for example from an argon gas.

EXAMPLE

Results of a dry etching process for the removal of $TiO_x$ with a high selectivity with respect to polysilicon and $SiO_2$ are presented below. For this purpose, titanium was sputtered onto an approximately 1.5 nm thick gate oxide comprising silicon oxide and was then completely oxidized all the way through by a high-temperature step in an oxygen atmosphere. The result was an approximately 10 nm thick $TiO_x$ which, with a polysilicon mask was then completely removed from the unmasked regions.

| Process steps | 1 | 2 | 3 | 4 | 5 |
| --- | --- | --- | --- | --- | --- |
| RF time (sec) | 0 | 2 | 30 | 10 | 0 |
| RF delay (sec) | 0.1 | 5 | 0 | 0 | 1 |
| RF power (W) | 0 | 900 | 900 | 900 | 0 |
| Pressure (Torr) | 1.1 | 0.7 | 0.7 | 1.1 | 1.1 |
| Gas 1: $O_2$ | 2000 | 400 | 3000 | 4200 | 2000 |
| Gas 2: $CF_4$ | 0 | 10 | 60 | 10 | 0 |
| Gas 3: $N_2$ | 200 | 100 | 400 | 200 | 0 |
| Temp. (° C.) | 230 | 230 | 230 | 230 | 230 |

-continued

It can be seen from the above table that first, in step 1, substantially only oxygen was introduced into the etching chamber, in order for the titanium to be converted as completely as possible into titanium oxide, so that it can subsequently be etched by means of $CF_4$. The fact that the oxygen level remains high (steps 2 to 4) serves to passivate the polysilicon or the silicon oxide.

After the removal of the titanium oxide, the gate oxide was completely intact, i.e. the etching process has a high selectivity with respect to silicon or silicon oxide.

Figure 4:
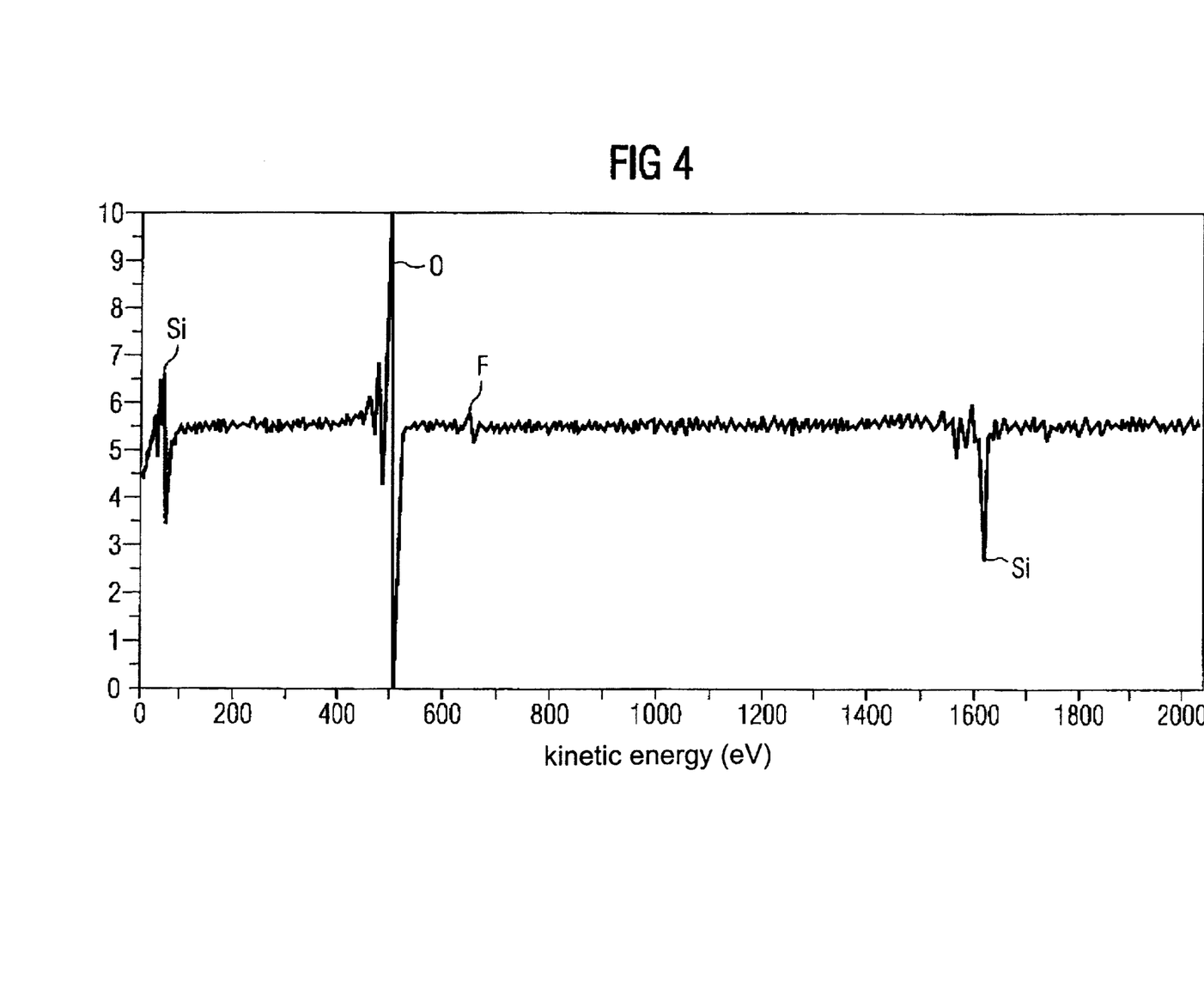
FIG. 4 is a graph showing an Auger analysis of a gate oxide after the removal of a titanium layer.

The gate oxide from which the titanium oxide layer had been removed was then subjected to an Auger analysis, in which it was impossible to detect any titanium or titanium oxide on the gate oxide (cf. FIG. 4). Apart from silicon and oxygen which emanate from the gate oxide, it was only possible to detect insignificant traces of carbon and fluorine. This indicates a very clean etching process. The measurement parameters used during the analysis were acceleration voltage U=10 kV, electron current I≈15 nA, substrate tilted through 30°, 4000× amplification.

Figure 6:
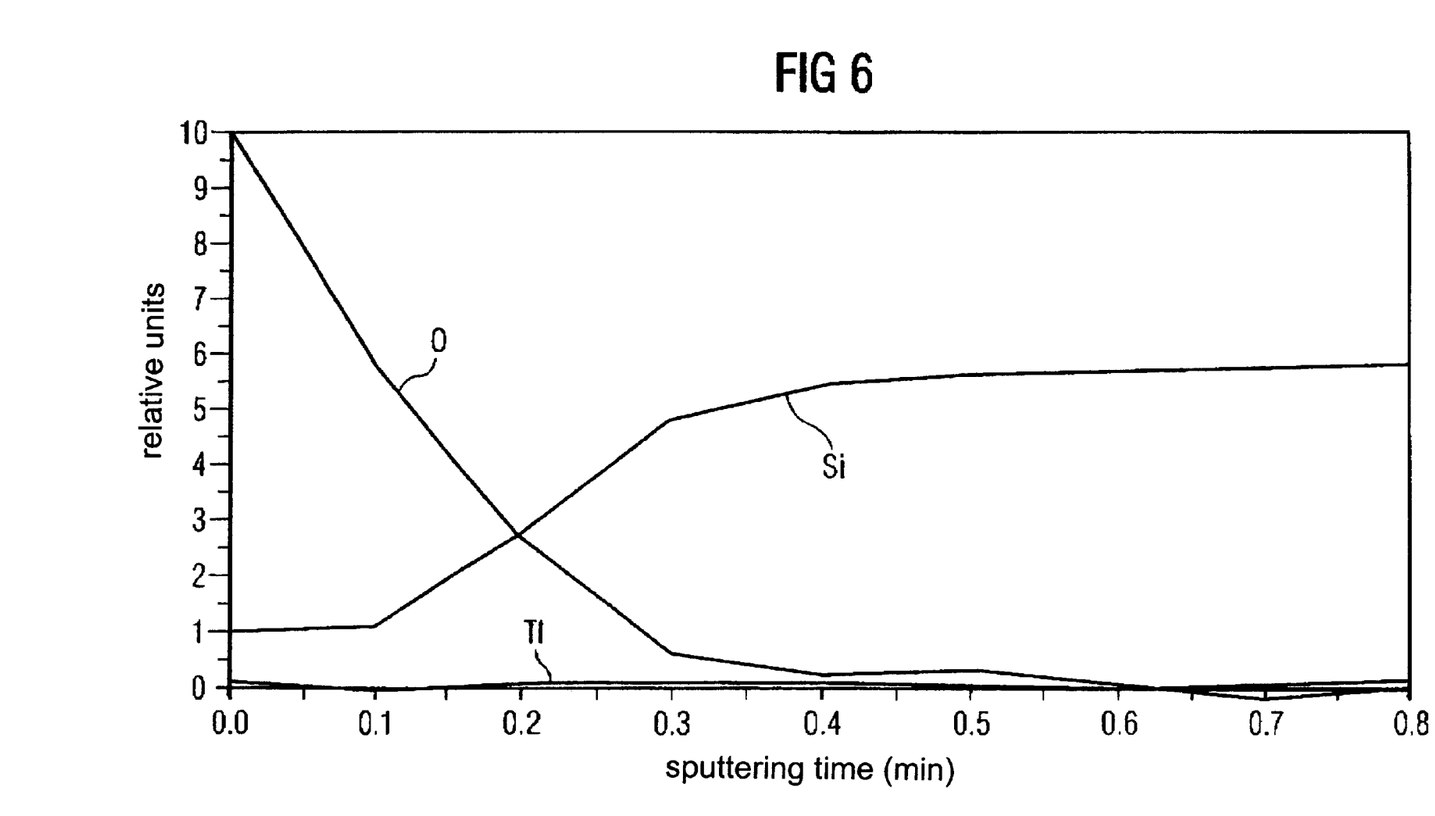
FIG. 6 is a graph showing an Auger depth analysis of the gate oxide.

An Auger depth analysis of the gate oxide remaining on the substrate revealed scarcely any detectable levels of titanium in the gate oxide. For this purpose, the gate oxide, after removal of the titanium layer, was abraded with argon ions for a certain time and was then subjected to an Auger analysis. The results are shown in FIG. 6.

Figure 5A:
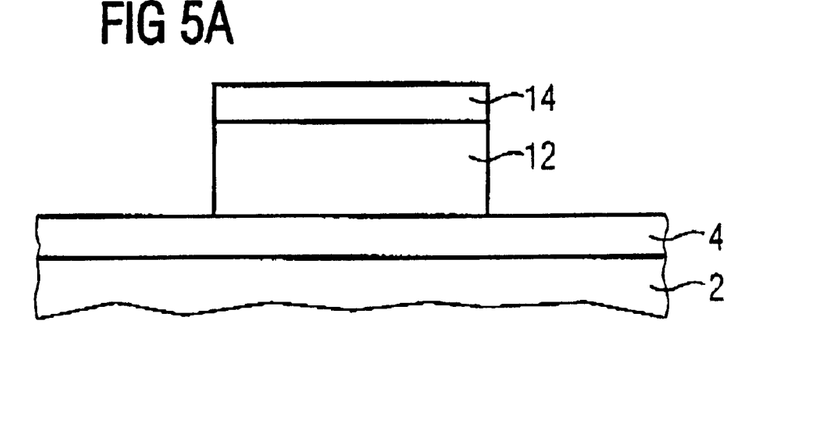
FIGS. 5A to 5C are partial side views illustrating individual process steps in the fabrication of a gate stack using the process according to the invention.
Figure 5B:
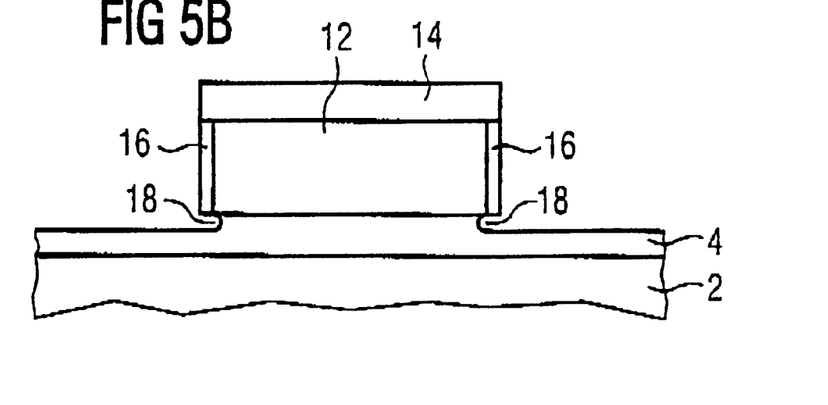
Figure 5C:
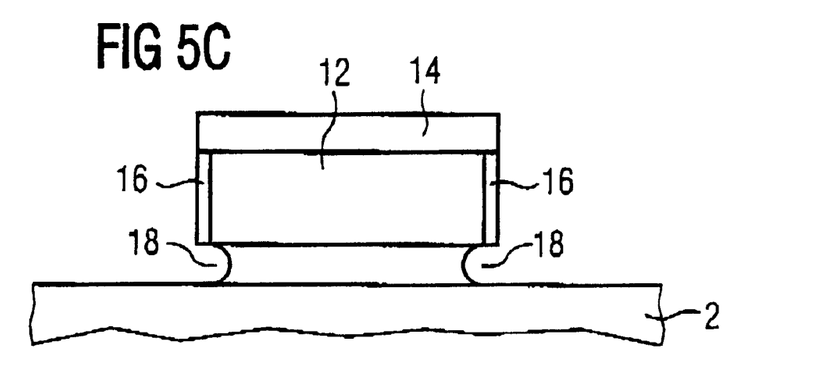
Figure 7:
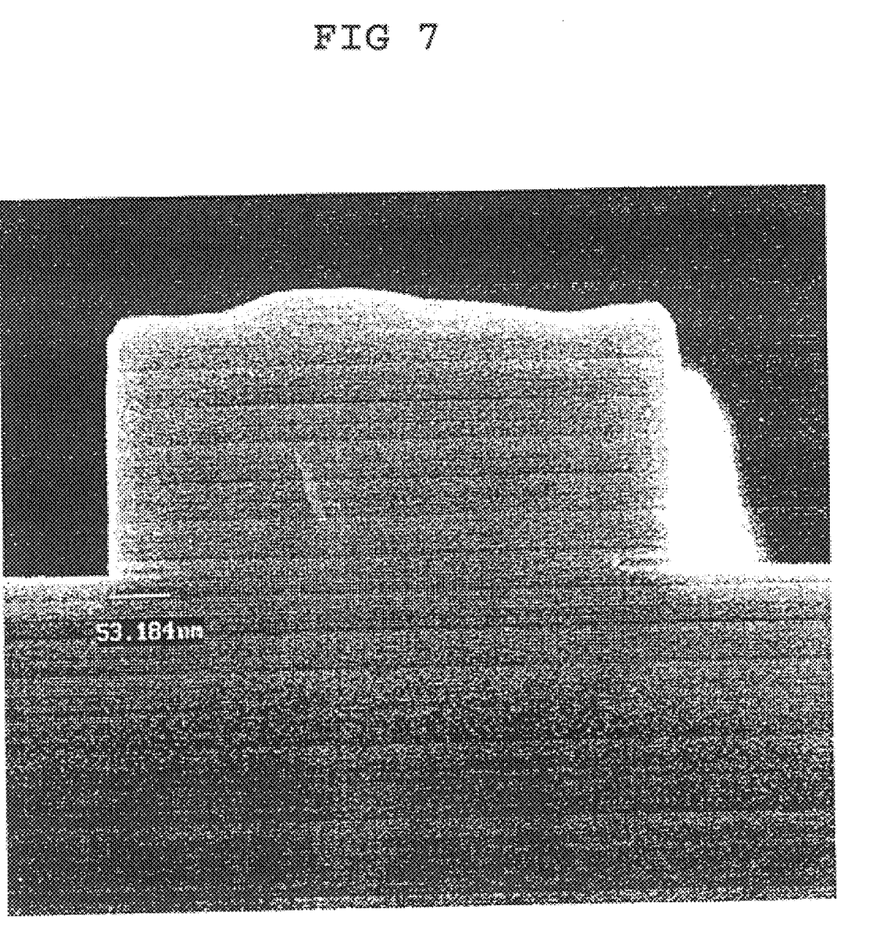
FIG. 7 is an SEM image (scanning electron micrograph) of a gate stack which has been etched using the process according to the invention.

The fact that the gate oxide is unaffected can be concluded once again from SEM (scanning electron microscope) examinations. Consequently, the etching process stopped on the gate oxide (silicon oxide) (FIG. 7). This image also reveals undercut etching of the polysilicon, the formation of which is shown in FIGS. 5A to 5C.

The etching process according to the invention is substantially isotropic in the absence of directed and accelerated ions. This is expressed, for example, in partial undercut etching of the polysilicon layer. For example, with the process parameters outlined above, an etching time of 30 seconds (based on the duration of action of $CF_4$) results in undercut etching of approx. 55 nm, compared with approximately 120 nm for an etching time of 60 sec. This is illustrated in FIGS. 5A to 5C. In FIG. 5A, there is a polysilicon 12 on the titanium oxide layer 4, and on the polysilicon there is a silicon oxide layer 14, which serves as a hard mask for structuring of the polysilicon layer 12 as gate. Then, the titanium oxide layer 4 is etched, the flanks 16 of the polysilicon layer 12 (gate) being passivated by oxidation under the action of the oxygen. After the etching of the titanium oxide layer 4, undercut etching regions 18 which continue inward from the edge region remain below the polysilicon layer 12, as shown in FIG. 5C. The height of the undercut etching 18 can be set appropriately by selecting the etching time.

We claim:

1. A method of structuring a metal-containing layer, which comprises the following steps:

providing a substrate with a metal-containing layer formed of a material selected from the group consisting of titanium, titanium oxide, tantalum, tantalum oxide, aluminum, aluminum oxide, and mixtures thereof;

applying and structuring an etching mask on the metal-containing layer; and etching the metal-containing layer, using the etching mask, in a plasma-assisted etching gas atmosphere at a temperature of over 130° C. and in a presence of at least one halogen compound and at least one oxidizing agent, wherein a concentration of the oxidizing agent is higher than a concentration of the halogen compound, and the halogen compound contains $NF_3$.

2. The process according to claim 1, wherein the halogen compound is a fluorinated carbon.

3. The process according to claim 1, wherein the halogen compound is a fluorinated hydrocarbon.

4. The process according to claim 1, which comprises using a halogen compound selected from the group consisting of $SF_6$ and $CF_4$.

5. The process according to claim 2, wherein the halogen compound is $CHF_3$.

6. The process according to claim 1, which comprises setting a temperature of above 200° C. during the etching step.

7. The process according to claim 1, which comprises setting a temperature to approximately 250° C. during the etching step.

8. The process according to claim 1, wherein the halogen compound is present in a concentration by volume of between 1% and 10%, and the oxidizing agent is present in a concentration by volume of between 90% and 99%.

9. The process according to claim 1, which comprises forming the etching mask of a material which, by reaction with the oxidizing agent, can be to a very great extent passivated with respect to the halogen compound.

10. The process according to claim 9, which comprises forming the etching mask of a material selected from the group consisting of silicon oxide and polysilicon.

11. The process according to claim 1, which comprises using oxygen as the oxidizing agent.

12. The process according to claim 1, which comprises assisting the etching of the metal-containing layer by additionally employing physical abrasion with ions.

* * * * *

UNITED STATES PATENT AND TRADEMARK OFFICE
CERTIFICATE OF CORRECTION

PATENT NO. : 6,511,918 B2
DATED : January 28, 2003
INVENTOR(S) : Stephan Wege et al.

It is certified that error appears in the above-identified patent and that said Letters Patent is hereby corrected as shown below:

<u>Title page</u>
Item [63], should read as follows:
-- Related U.S. Application Data
Continuation of application No. PCT/DE99/03876, filed on Dec. 3, 1999. --

Signed and Sealed this

Twentieth Day of May, 2003

JAMES E. ROGAN
*Director of the United States Patent and Trademark Office*